（12）United States Patent
Yang et al.

(10) Patent No.: US 11,058,019 B1
(45) Date of Patent: Jul. 6, 2021

(54) ELECTRONIC DEVICE

(71) Applicant: Wistron Corp., New Taipei (TW)

(72) Inventors: Hung-Sen Yang, New Taipei (TW); Chang-Feng Lan, New Taipei (TW); Tat Yan Chan, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/819,648

(22) Filed: Mar. 16, 2020

(30) Foreign Application Priority Data

Dec. 25, 2019 (TW) .................... 108147654

(51) Int. Cl.
*H05K 5/02* (2006.01)
*H05K 5/03* (2006.01)

(52) U.S. Cl.
CPC ............ *H05K 5/023* (2013.01); *H05K 5/03* (2013.01)

(58) Field of Classification Search
None
See application file for complete search history.

(56) References Cited

U.S. PATENT DOCUMENTS

| | | | | |
|---|---|---|---|---|
| 5,195,183 A * | 3/1993 | Miller | ............... | G07C 5/0808 709/231 |
| 5,349,497 A * | 9/1994 | Hanson | ............... | B60R 11/02 16/422 |
| 5,475,206 A * | 12/1995 | Reddersen | ......... | G06K 7/10653 235/462.39 |
| 5,736,726 A * | 4/1998 | VanHorn | ............ | G06K 7/10881 200/61.02 |
| 5,763,865 A * | 6/1998 | Swift | ............... | G06K 7/10881 235/383 |
| 6,129,282 A * | 10/2000 | Reddersen | ......... | G06K 7/10881 235/454 |
| 6,299,067 B1 * | 10/2001 | Schmidt | ............ | G06K 7/10663 235/462.45 |
| 6,321,990 B1 * | 11/2001 | Giordano | ........... | G06K 7/10633 235/462.45 |
| 6,708,887 B1 * | 3/2004 | Garrett | .................. | G06F 1/1626 235/462.45 |
| 7,673,804 B1 * | 3/2010 | Hinson | ............. | G06K 7/10881 235/472.01 |
| 7,857,226 B2 * | 12/2010 | Mangaroo | ......... | G06K 7/10881 235/472.01 |
| 8,267,323 B2 * | 9/2012 | Studer | ....................... | B41J 3/36 235/472.01 |

(Continued)

FOREIGN PATENT DOCUMENTS

| | | |
|---|---|---|
| CN | 206892747 U | 1/2018 |
| CN | 209449065 U | 9/2019 |

OTHER PUBLICATIONS

Taiwan Patent Office, "Office Action", "108147654", dated Sep. 14, 2020, Taiwan.
TW OA 10920881020 dated Sep. 14, 2020.

*Primary Examiner* — Xanthia C Cunningham
(74) *Attorney, Agent, or Firm* — Locke Lord LLP; Tim Tingkang Xia, Esq.

(57) ABSTRACT

The disclosure relates to an electronic device including a device main portion and a handle portion. The handle portion is connected to the device main portion. The handle portion includes at least one cushioning unit and an outer sleeve. The at least one cushioning unit extends in a direction away from the device main portion, and the outer sleeve is sleeved on the at least one cushioning unit.

20 Claims, 12 Drawing Sheets

(56) References Cited

U.S. PATENT DOCUMENTS

| | | | | |
|---|---|---|---|---|
| 9,727,083 | B2* | 8/2017 | Chamberlin | H04M 1/04 |
| 10,049,831 | B2* | 8/2018 | Minaf | G06K 7/10881 |
| 10,177,799 | B2* | 1/2019 | Brownlow | H04B 1/3888 |
| 2006/0266841 | A1* | 11/2006 | Hansen | G06F 1/1684 |
| | | | | 235/472.02 |
| 2011/0103004 | A1* | 5/2011 | Brock | G06F 1/1632 |
| | | | | 361/679.43 |
| 2014/0105591 | A1* | 4/2014 | Van Norman | G03B 17/38 |
| | | | | 396/544 |
| 2015/0063795 | A1* | 3/2015 | Orton | F16M 11/041 |
| | | | | 396/425 |
| 2015/0193645 | A1* | 7/2015 | Colavito | G06K 7/10881 |
| | | | | 235/472.01 |
| 2015/0355681 | A1* | 12/2015 | Chen | G06F 1/1654 |
| | | | | 361/679.56 |
| 2018/0217638 | A1* | 8/2018 | Ohtaka | G06F 1/1626 |

* cited by examiner

ELECTRONIC DEVICE

CROSS-REFERENCE TO RELATED APPLICATIONS

This non-provisional application claims priority under 35 U.S.C. § 119(a) on Patent Application No(s). 108147654 filed in Taiwan (ROC) on Dec. 25, 2019, the entire contents of which are hereby incorporated by reference.

TECHNICAL FIELD

The disclosure relates to an electronic device, more particularly to an electronic device with a handle that is capable of absorbing shock.

BACKGROUND

Depending on work requirements in areas, such as industrial factories, warehouses, or construction sites, workers may carry an electronic device such as a scanner for scanning goods or a flashlight for security. And the device usually has a handle to make it easy to use and operate.

In addition to the operation of the device that needs to be reliable under various environments, whether the device is drop-proof or has the ability to protect itself from impact force is also a key factor for quality since it is known that proper protection against impact force can help to avoid damage to the structure or internal electrical components of the device.

According to the drop tests of the conventional electronic devices having a handle, because of their specific shape and center of gravity, they usually hit the ground with the handle after falling from a high position. As tested, most of the handles were deformed or broken by hitting the ground, even causing damages to the internal electrical components, such as circuit board bending.

Some of the handles are wrapped with soft silicone material for reducing or absorbing external force, however, from the testing results that the handle with simply wrapping a layer of silicone has a very limited cushioning and is still unable to improve the aforementioned issues.

As such, any shock or impact force may cause serious damage to the conventional electronic devices with handles, which leads to unnecessary maintenance or replacement of components of the devices once a while and thus resulting in unnecessary labor and activity costs.

SUMMARY

One embodiment of the disclosure provides an electronic device including a device main portion and a handle portion. The handle portion is connected to the device main portion. The handle portion includes at least one cushioning unit and an outer sleeve. The at least one cushioning unit extends in a direction away from the device main portion, and the outer sleeve is sleeved on the at least one cushioning unit.

Another embodiment of the disclosure provides an electronic device including a device main portion and a handle portion. The handle portion is connected to the device main portion. The handle portion includes at least one cushioning unit. The at least one cushioning unit extends in a direction away from the device main portion. The at least one cushioning unit has at least two elastic arm portions and a hollow portion formed between the at least two elastic arm portions.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

In addition, for the purpose of simple illustration, well-known features may be drawn schematically, and some unnecessary details may be omitted from the drawings. And the size or ratio of the features in the drawings of the present disclosure may be exaggerated for illustrative purposes, but the present disclosure is not limited thereto. Note that the actual size and designs of the product manufactured based on the teaching of the present disclosure may also be properly modified according to any actual requirement.

Further, as used herein, the terms "end", "part", "portion" or "area" may be used to describe a technical feature on or between component(s), but the technical feature is not limited by these terms. In addition, unless otherwise specified, the term "substantially", "approximately" or "about" may be used herein to provide an industry-accepted tolerance to its corresponding term without resulting in a change in the basic function of the subject matter at issue.

Furthermore, unless otherwise defined, all the terms used in the disclosure, including technical and scientific terms, have their ordinary meanings that can be understood by those skilled in the art. Moreover, the definitions of the above terms are to be interpreted as being consistent with the technical fields related to the disclosure. Unless specifically defined, these terms are not to be construed as too idealistic or formal meanings.

Figure 1:
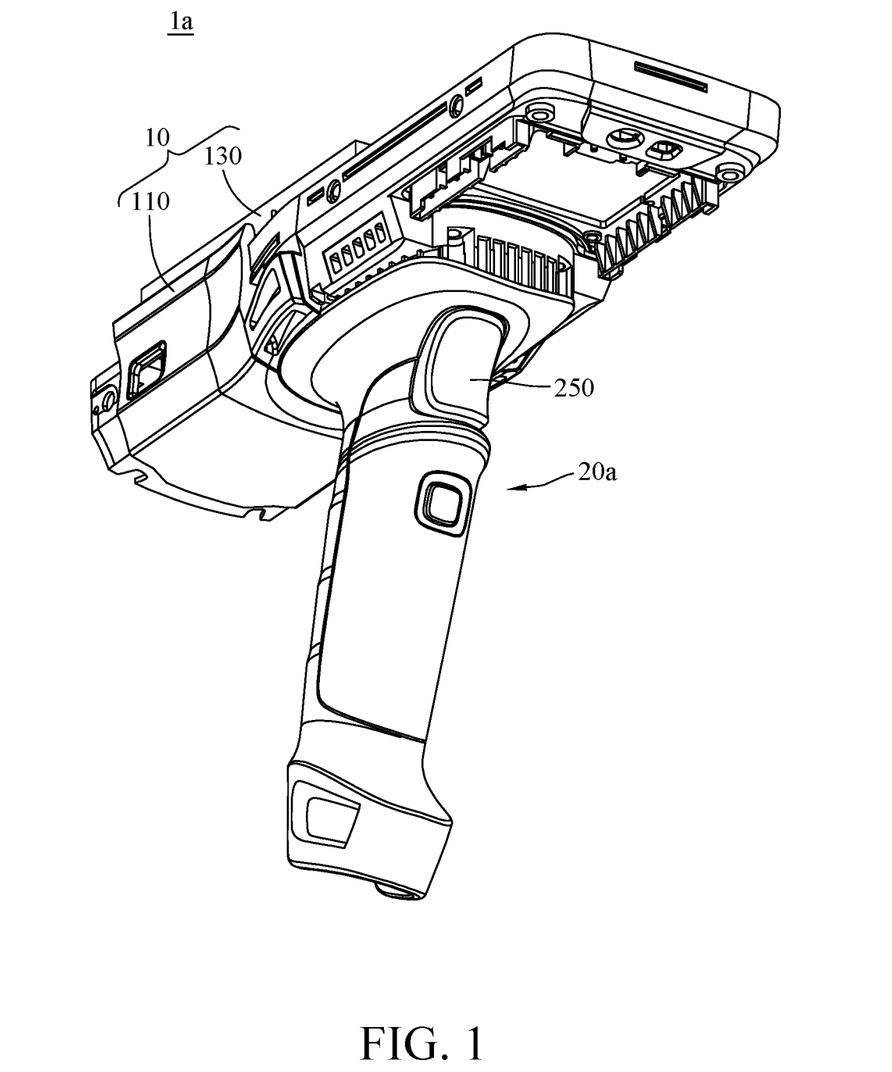
FIG. 1 is a perspective view of an electronic device according to one embodiment of the disclosure.

Firstly, referring to FIG. 1, one embodiment of the disclosure provides an electronic device 1a. For illustrative purposes, some components, such as casing and wires, in the later drawings may not be fully depicted or may be omitted. As shown, the electronic device 1a may be a handheld electronic device and may at least include a device main portion 10 and a handle portion 20a. The device main portion 10 may include a main casing 110 and a function unit 130. The function unit 130 is equipped on the main casing 110 and is used to provide required functions of the electronic device 1a. The function unit 130 is, for example, a scanner, but the disclosure is not limited by the function unit 130, its function, and how is it disposed on the main casing 110. The handle portion 20a is connected to the main casing 110 of the device main portion 10 and is in a shape and size that is comfortable to hold and use.

In addition, in this embodiment or some other embodiments, the handle portion 20a may have a button 250 disposed thereon and for user to operate specific functions of the electronic device 1a. In addition, the handle portion 20a may be wrapped by silicone material to provide a comfortable hand feeling and also to serve as a shock resistance layer to reduce or absorb external force.

Figure 2:
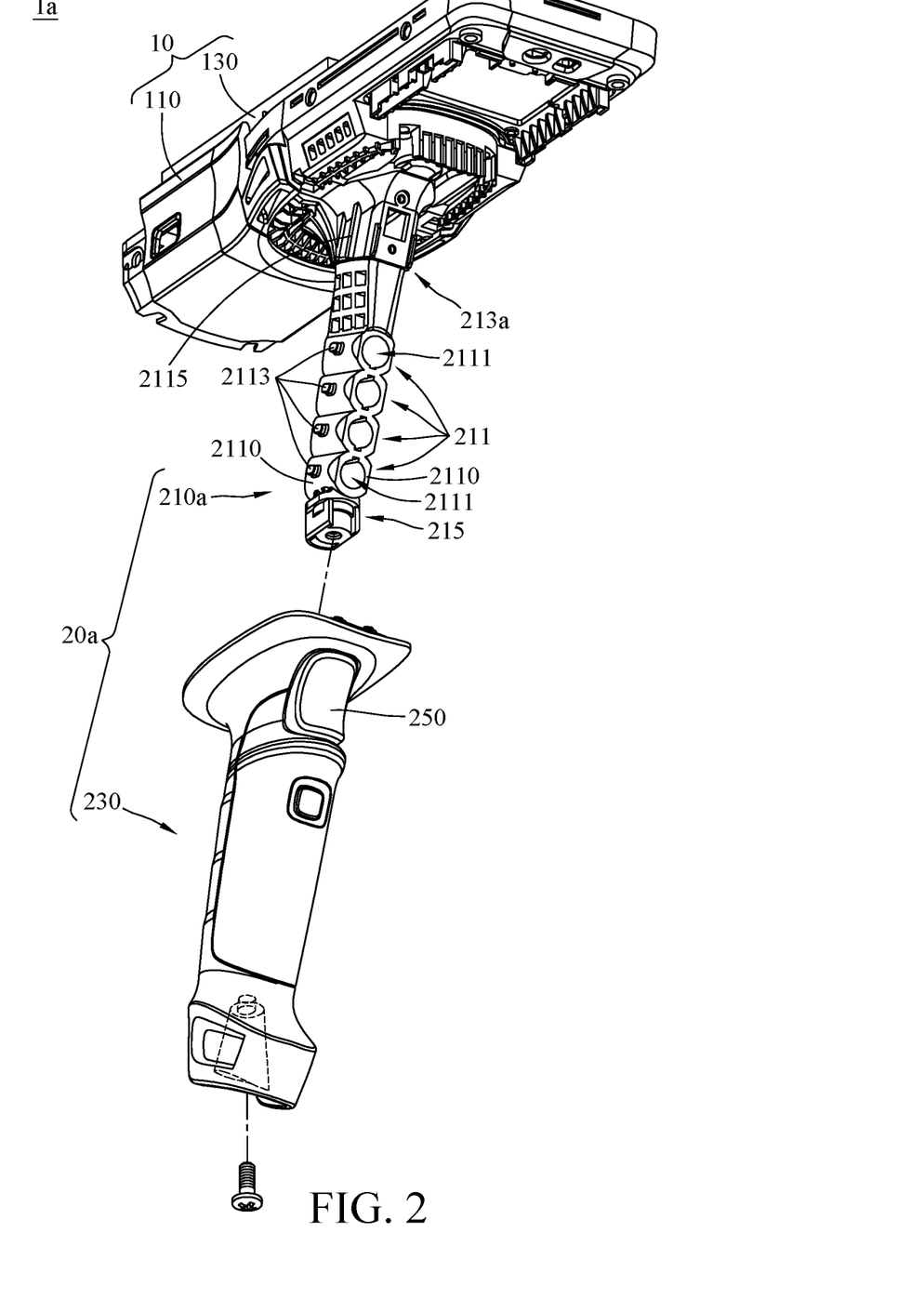
FIG. 2 is an exploded perspective view of the electronic device in FIG. 1.

In addition to the aforementioned layer of silicone, the handle portion 20a has a specific shock-absorbing arrangement therein to improve the ability of the electronic device 1a in shock absorption. Herein, please further refer to FIG. 2, wherein FIG. 2 is an exploded perspective view of the electronic device 1a in FIG. 1. As shown, in this embodiment, the handle portion 20a may include a handle core 210a and an outer sleeve 230, the handle core 210a protrudes from the main casing 110 of the device main portion 10 towards in a direction away from the main casing 110, and the outer sleeve 230 is detachably sleeved on the handle core 210a.

In this embodiment, the handle core 210a and the main casing 110 may be formed into a single piece or they may be two independent pieces being assembled together, but the disclosure is not limited thereto. The material and shape of the handle core 210a make it able to support the device main portion 10 and to bear gripping and also allow it to acquire a desired degree of elasticity and flexibility so as to generate a recoverable deformation in response to an external force; however, the disclosure is not limited by the material of the handle core 210a.

In addition, the outer sleeve 230 is, but not limited to, made of a single piece, and may have a distribution of hard and soft materials at the same time, where the soft materials can reduce or absorb shock and are comfortable to hold, and the hard materials can be used to maintain the required contour of the outer sleeve 230; however, the disclosure is not limited by the outer sleeve 230 and its material and the distribution of the hard and soft materials on the outer sleeve 230.

Further, in this embodiment, the handle core 210a may include a plurality of cushioning units 211, a neck portion 213a, and a mount end 215. The neck portion 213a is connected to and located between the handle core 210a and the main casing 110. The cushioning units 211 are connected in series and extend in a direction away from the main casing 110 from the neck portion 213a, in other words, the cushioning units 211 are connected to the main casing 110 via the neck portion 213a. As shown, the extension or arrangement direction of the cushioning units 211 is substantially the same as the extension direction of the handle portion 20a, and the cushioning units 211 are, but not limited to, made of a single piece. In addition, in the handle core 210a, the quantity of the cushioning units 211 is not particularly limited and may be modified according to actual requirements; for example, in some embodiments, there may be only one cushioning unit on the handle core.

The mount end 215 is connected to one of the cushioning units 211 that is located the furthest away from the neck portion 213a; in other words, the cushioning units 211 are located between the neck portion 213a and the mount end 215. In some embodiments, the mount end 215 may be integrally formed with the cushioning units 211.

More specifically, as shown, each of the cushioning units 211 may be a hollow structure in a cylinder-like shape that has at least two elastic arm portions 2110 and at least one hollow portion 2111 formed between the elastic arm portions 2110. In such a configuration, the elastic arm portions 2110 can be elastically deformed by a certain amount of external force applied to the cushioning unit 211 to reduce or absorb the external force, and the deformed elastic arm portions 2110 will return to its original shape when the force is canceled.

As shown, in this embodiment, the hollow portions 2111 of the cushioning units 211 are not directly connected to one another, but the disclosure is not limited thereto; for example, in some other embodiments, the adjacent hollow portions 2111 of the cushioning units 211 may be directly connected to each other.

Figure 3:
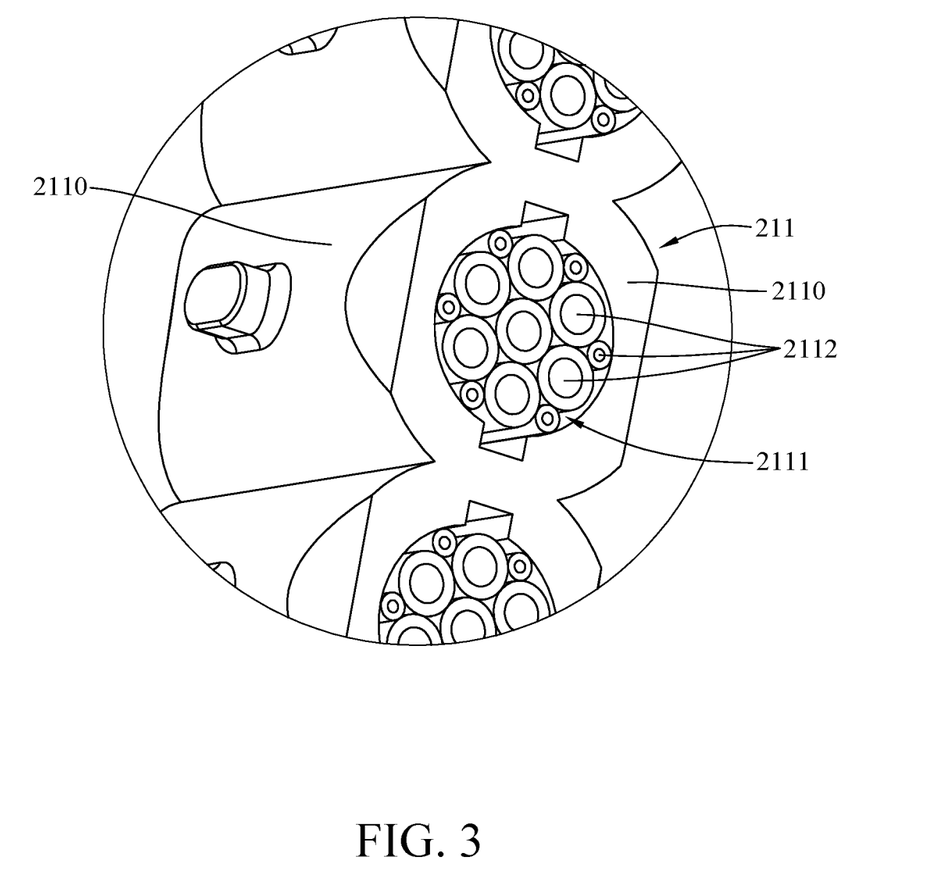
FIG. 3 is a partial enlarged view of a handle core according to one embodiment of the disclosure.

Herein, please further refer to FIG. 3, FIG. 3 depicts a partial enlarged view of the handle core 210a according to one embodiment of the disclosure. As shown, in the previous or another embodiment of the disclosure, the handle core 210a may further include a plurality of damping members 2112. Note that, except for FIG. 3, the other drawings omit the damping member for the purpose of simple illustration. The damping members 2112 are configured to be filled in the hollow portions 2111 of the cushioning units 211. Each of the damping members 2112 is, but not limited to, in a cylinder shape and made of any suitable elastic and flexible material. As such, the damping members 2112 can be elastically deformed by a certain amount of external force applied to the cushioning units 211 to reduce or absorb the external force, and the deformed damping members 2112 will return to its original shape when the force is canceled. Therefore, the damping members 2112 are able to effectively reduce or absorb the external force applied to the cushioning units 211 so as to further improve the cushioning ability of the handle portion 20a.

Note that the disclosure is not limited by the damping member and its design; for example, in some embodiments, the handle portion may not contain any of the aforementioned damping members; or, in some other embodiments, the damping member may be a honeycomb structure that is integrally formed with the cushioning unit or is additionally filled into the cushioning unit. Note that any suitable structure that can help to improve the cushioning ability of the handle portion may be employed as the damping member of the disclosure.

Figure 4:
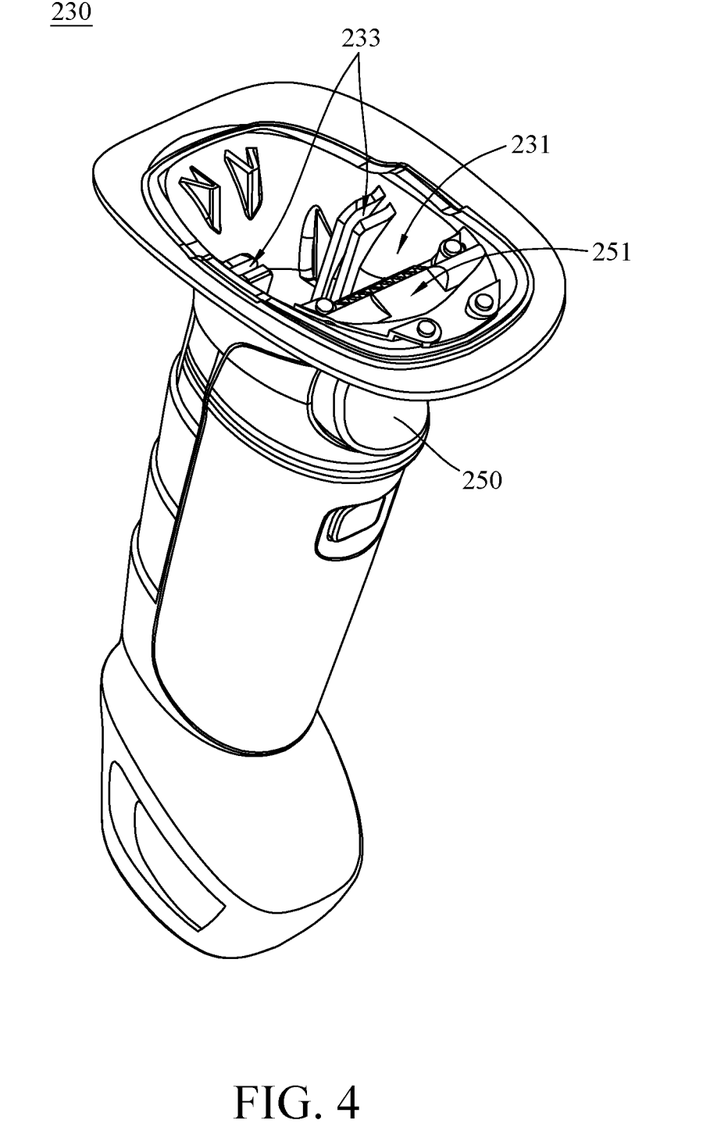
FIG. 4 is a perspective view of an outer sleeve in FIG. 2.

Then, please refer back to FIG. 2 and further refer to FIG. 4, where FIG. 4 is a perspective view of the outer sleeve 230 in FIG. 2. In this embodiment or some other embodiments, each cushioning unit 211 may have at least one first guiding structure 2113, the outer sleeve 230 may include an accommodation portion 231 and at least one second guiding structure 233, and the handle core 210a may further include at least one third guiding structure 2115. Specifically, the first guiding structure 2113 is a protrusion protruding outwards from the surface of cushioning unit 211 in a direction away from hollow portion 2111; the third guiding structure 2115 is a strip of block located on the neck portion 213a of the handle core 210a; the accommodation portion 231 is a hollow space of the outer sleeve 230 and can be used to accommodate the handle core 210a; and the second guiding structures 233 are located in the accommodation portion 231 and are served as rails for the first guiding structures 2113 of the cushioning unit 211 to slide thereon.

As the dotted-line shown in FIG. 2, the handle core 210*a* is allowed to be inserted into the outer sleeve 230 to assemble the handle core 210*a* and the outer sleeve 230. During the insertion of the handle core 210*a*, the first guiding structures 2113 of the cushioning units 211 can be slid into and guided by the second guiding structures 233 of the outer sleeve 230 so as to be moved towards the required direction; and the neck portion 213*a* of the handle core 210*a* is then slid into the accommodation portion 231 so that the third guiding structures 2115 thereon are slid into the second guiding structures 233 and thus the handle core 210*a* is kept being guided by the second guiding structures 233. As the handle core 210*a* reaches the required position, a suitable fastener (not numbered), such as a screw or bolt, can be screwed into the mount end 215 of the handle core 210*a* via the screw hole (not numbered) on the bottom of the outer sleeve 230. By doing so, the outer sleeve 230 can be firmly fixed onto the handle core 210*a*. As discussed, the outer sleeve 230 can be assembled or removed from the handle core 210*a* in a few simple steps.

Note that the quantities of the first guiding structures 2113 of each cushioning unit 211, the third guiding structures 2115 on the neck portion 213*a*, and the second guiding structures 233 in the outer sleeve 230 all may be adjusted according to actual requirements and are not particularly limited to the shown embodiment. In addition, the aforementioned mount end 215 may be optional; in some other embodiments, the handle core may not have the aforementioned mount end 215, in such a case, the handle core and the outer sleeve may be fixed to each other in a tight-fit manner. Alternatively, in one embodiment, the top part of the outer sleeve may be fixed to the main casing via one or more screws; or, in yet another embodiment, the top part of the outer sleeve may be partially detachably embedded into the main casing to be fixed to the main casing, but the disclosure is not limited by how the outer sleeve is fixed in place. In addition, in order to make the outer sleeve 230 comfortable to hold and easy to grip, the outer sleeve 230 may have a shape different from that of the handle core 210*a*; in such a case, the outer sleeve 230 may have one or more rib structures (not numbered) therein to space the inner wall of the outer sleeve 230 and the handle core 210*a* by a suitable distance and to hold the handle core 210*a* at the desired position, but the disclosure is not limited thereto.

In addition, in this embodiment or some other embodiments, the aforementioned button 250 is equipped on the outer sleeve 230, and the circuit board (e.g., an electronic component set 251 shown in FIG. 4) that is for the installation of the button 250 and electrically connected to and can be activated by the button 250 as well as the associated wiring are all arranged in the accommodation portion 231 of the outer sleeve 230. That is, the button 250 and the electronic component set 251 are both installed on the outer sleeve 230 so that they can be assembled to or detached from the handle core 210*a* together with the outer sleeve 230. As such, it would be easy to replace the button 250 and the electronic component set 251, which facilitates the maintenance process of the device. Also, since the button 250 and the electronic component set 251 are disposed on the outer sleeve 230 instead of being directly fixed to the handle core 210*a* that is mainly in charge of force transmitting and shock absorbing, the stress on the handle core 210*a* would not cause too much shock on the button 250 and the electronic component set 251.

Figure 5:
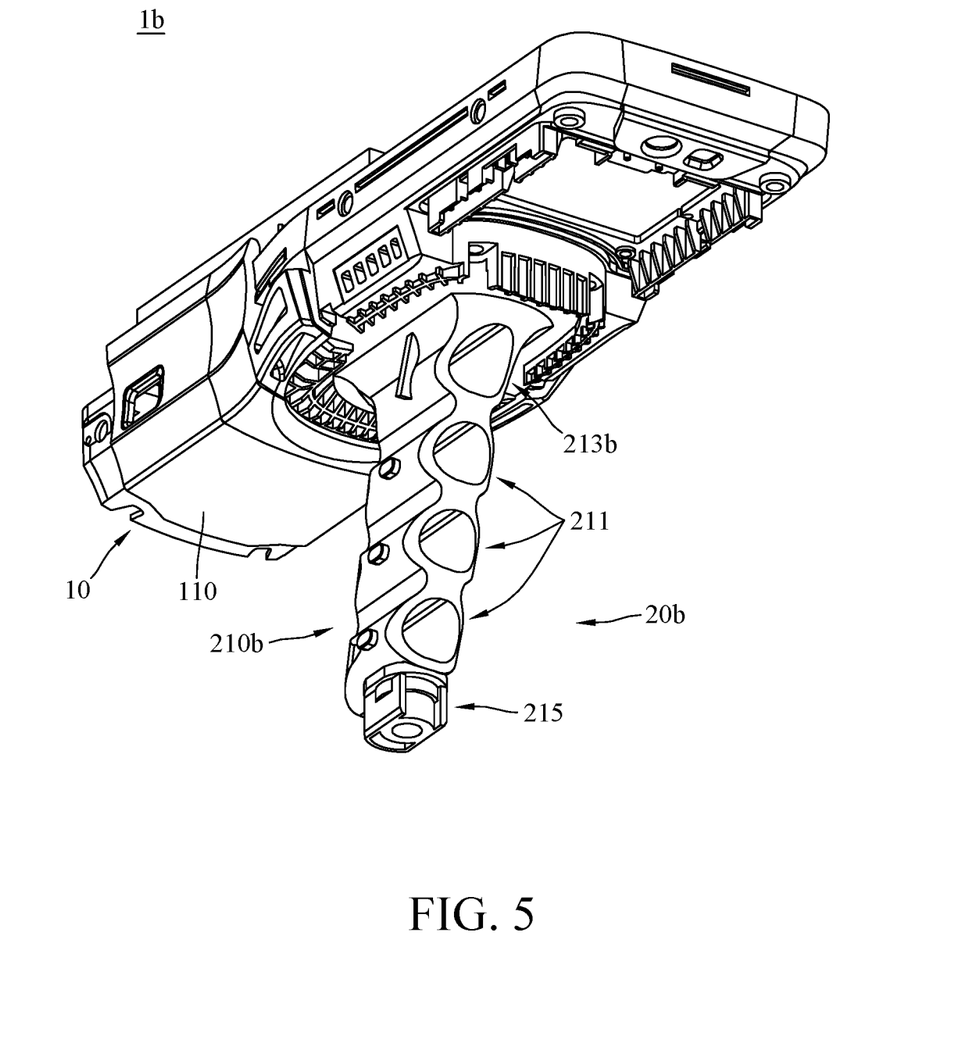
FIG. 5 is a perspective view of an electronic device according to another embodiment of the disclosure.

The above is merely one of the exemplary handle portions of the disclosure and the disclosure is not limited thereto. For example, please refer to FIG. 5, where FIG. 5 is a perspective view of an electronic device 1*b* according to another embodiment of the disclosure. Note that FIG. 5 omits the outer sleeve and some other components for the purpose of simple and clear illustration. In addition, one of the main differences between the electronic device 1*b* of this embodiment and the electronic device of the previous embodiments is the design of the handle portion, thus only the differences will be described below, and the same or similar components can be comprehended with the reference of the aforementioned discussions.

In this embodiment, in the electronic device 1*b*, a handle portion 20*b* includes a handle core 210*b*, the handle core 210*b* has a neck portion 213*b* that has the same or similar configuration to the cushioning unit 211; in such a case, the neck portion 213*b* is able to absorb shock as the cushioning unit 211 does. In addition, the aforementioned damping member may be applied to the hollow portion of the neck portion 213*b* to further improve the cushioning ability of the handle core 210*b*, but the adding of the damping member is optional.

Figure 6:
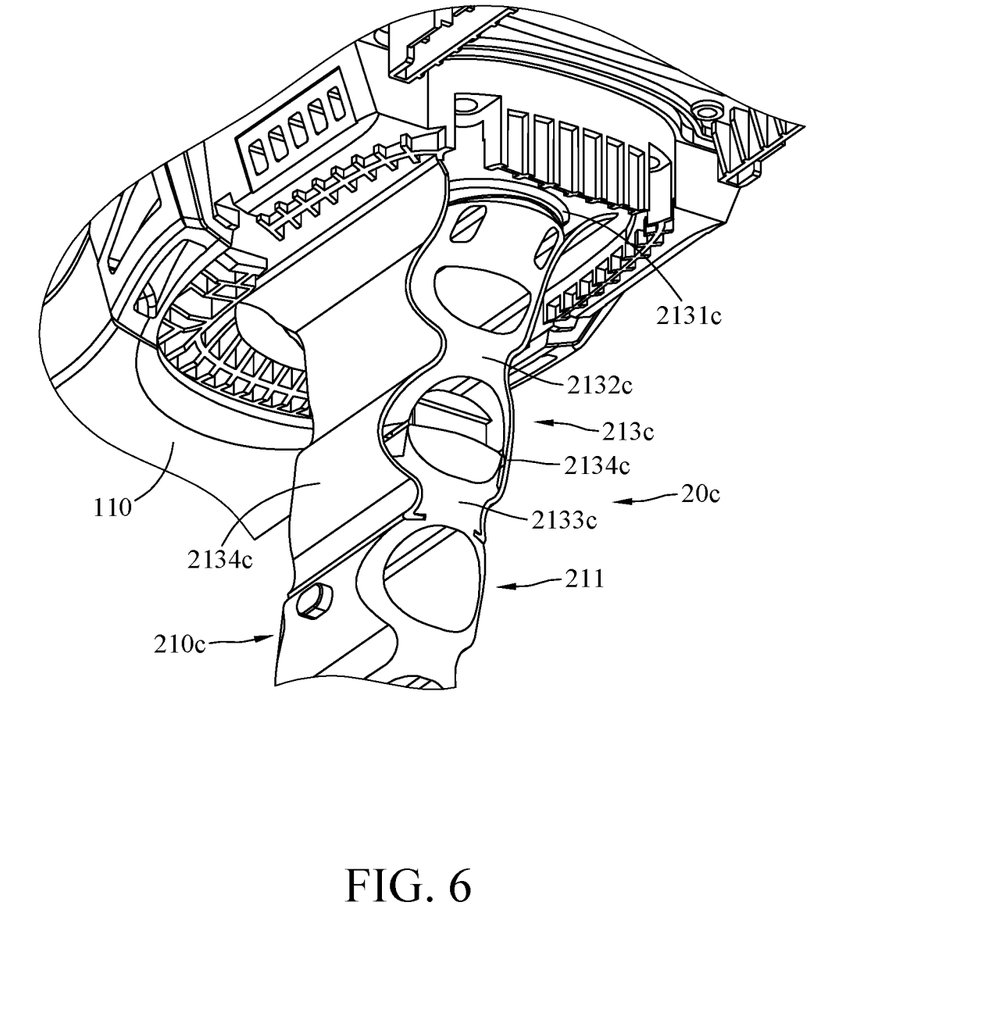
FIG. 6 is a partial enlarged perspective view of an electronic device according to still another embodiment of the disclosure.
Figure 7A:
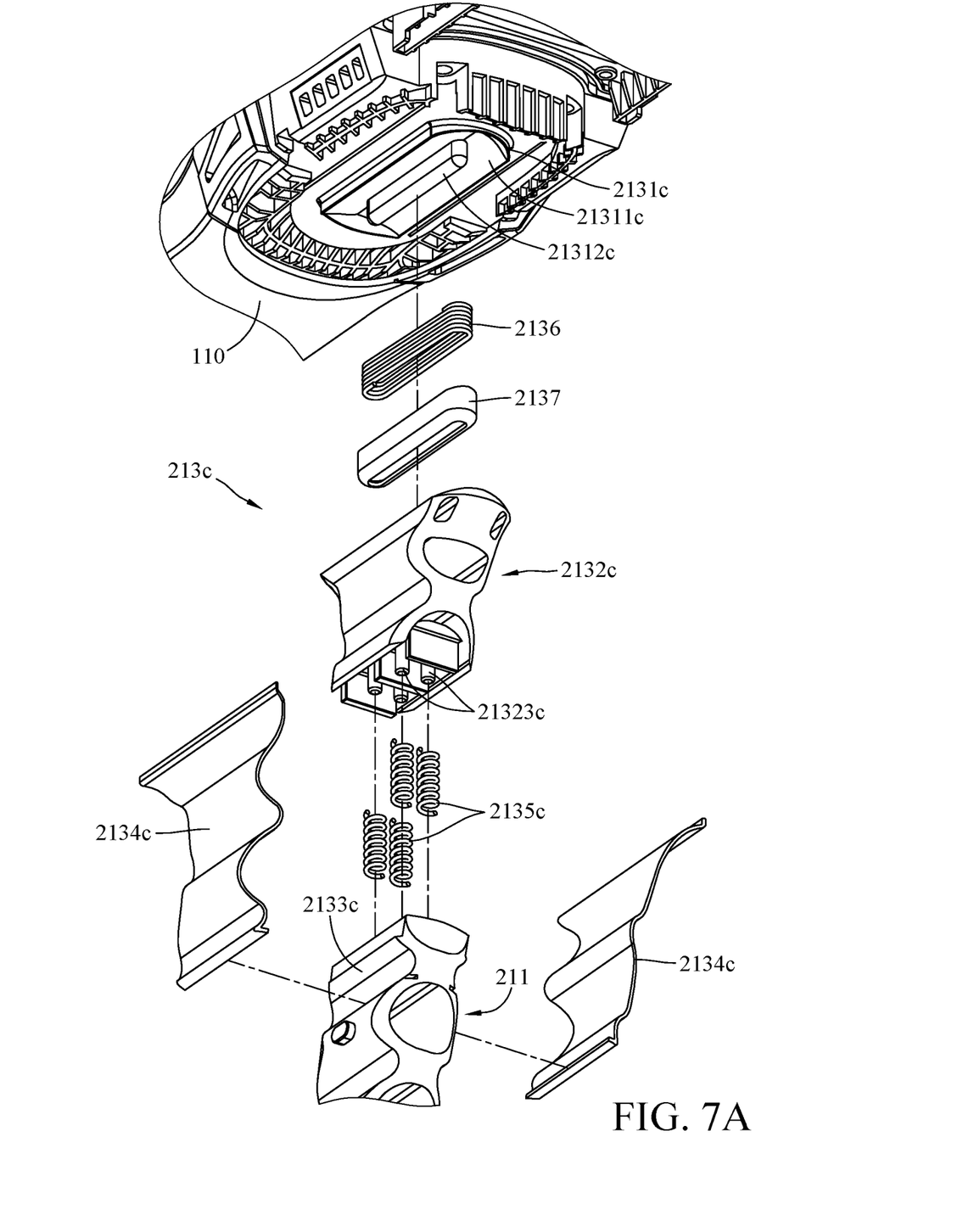
FIGS. 7A-7B illustrate exploded perspective views of a neck portion in FIG. 6 and taken from different viewpoints.
Figure 7B:
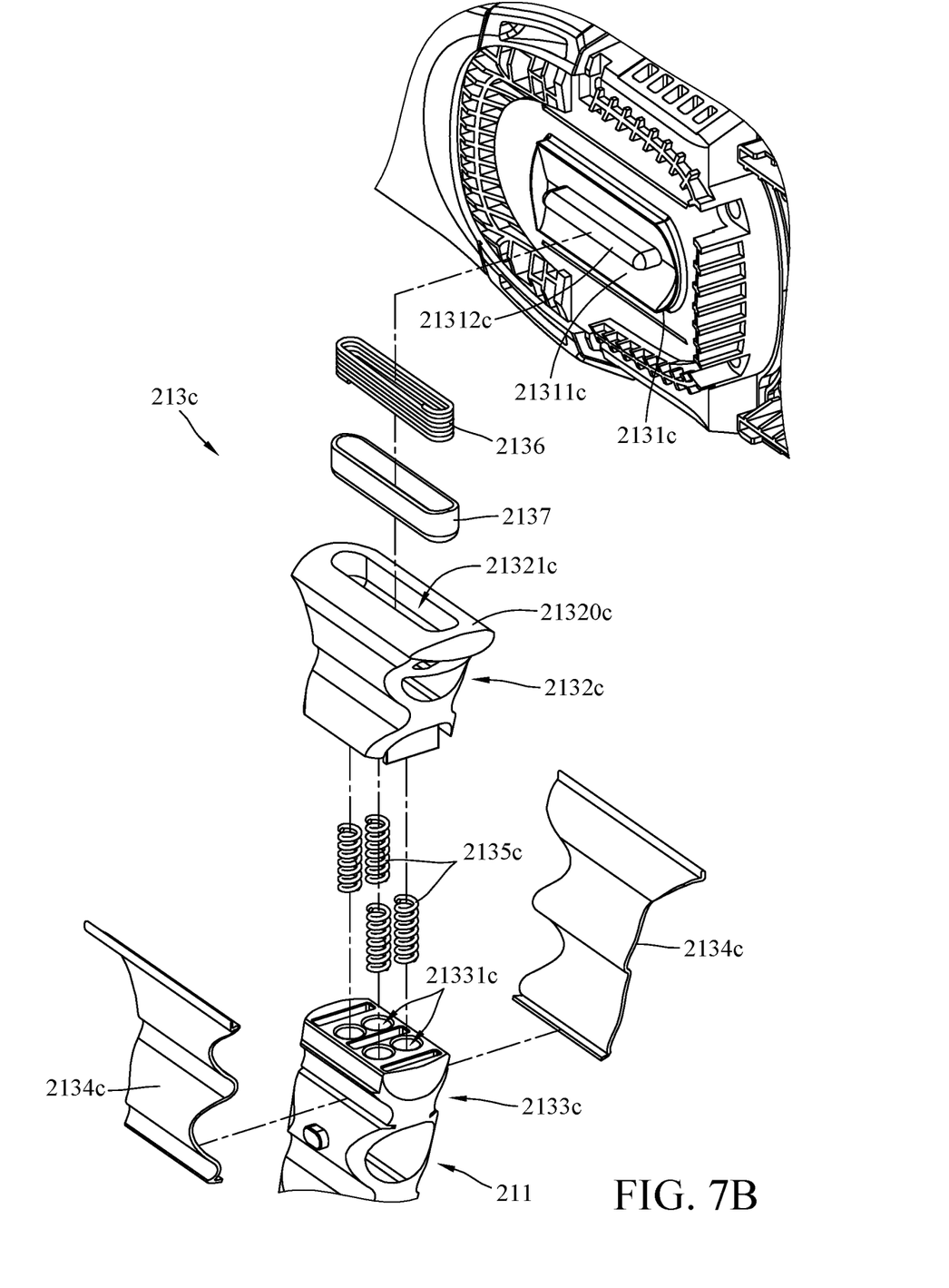

Then, please refer to FIGS. 6-8, the handle portions of other embodiments of the disclosure are introduced hereinafter. For the purpose of simple and clear illustration, FIGS. 6-8 may only illustrate part of the handle portion and may omit the outer sleeve. In addition, one of the main differences between this and previous embodiments is the design of the handle portion and the associated features, thus only the differences will be described below, and the same or similar components can be comprehended with the reference of the aforementioned discussions.

As shown, in this embodiment, a handle portion 20*c* has a handle core 210*c*, the handle core 210*c* has a neck portion 213*c*, and the neck portion 213*c* may include a dock 2131*c*, a movable component 2132*c*, at least one elastic supporting component 2134*c*, at least one first elastic component 2135*c*, a second elastic component 2136, a damper 2137, and a connecting portion 2133*c*. The connecting portion 2133*c* is located at an end of the cushioning unit 211 close to the main casing 110.

The dock 2131*c* is disposed on the main casing 110 and may be integrally formed with the main casing 110 or may be additionally fixed to the main casing 110. The dock 2131*c* has a contact surface 21311*c* facing the cushioning unit 211. In this embodiment, the contact surface 21311*c* may be a curved concave. In addition, the dock 2131*c* further includes a protrusion 21312*c* protruding towards the cushioning unit 211 from the contact surface 21311*c*. In this embodiment, the protrusion 21312*c* may be a strip of block.

The movable component 2132*c* has a top surface 21320*c* configured to contact the contact surface 21311*c* of the dock 2131*c*. In this embodiment, the top surface 21320*c* of the movable component 2132*c* may be a curved convex matching the shape of the contact surface 21311*c*. In addition, the movable component 2132*c* further has a recess 21321*c*, the recess 21321*c* is formed on the top surface 21320*c*, the protrusion 21312*c* on the dock 2131*c* is movably located in the recess 21321*c*. In such an arrangement, the top surface 21320*c* of the movable component 2132*c* can movably contact the contact surface 21311*c* of the dock 2131*c*, and the movable component 2132*c* is allowed to do a limited range of swinging movement relative to the dock 2131*c*, such that the relative movements of the movable component 2132*c* and the main casing 110 are limited within a specific angle range.

In this embodiment, the elastic component 2136 and the damper 2137 may be disposed in the space formed by the protrusion 21312*c* of the dock 2131*c* and an inner wall (not numbered) of the recess 21321c of the movable component 2132c. More specifically, the elastic component 2136 is sleeved on the protrusion 21312c of the dock 2131c, and the damper 2137 is sleeved on the elastic component 2136 and therefore is located between the elastic component 2136 and the inner wall of the recess 21321c of the movable component 2132c, wherein the elastic component 2136 is, but not limited to, a compression spring, and the damper 2137 is, but not limited to, made of any suitable elastic and flexible material, such as rubber. As such, the cooperation of the elastic component 2136 and the damper 2137 is able to give multi-directional cushioning during the movement of the movable component 2132c relative to the dock 2131c. However, the elastic component 2136 and the damper 2137 may be optional and are not intended to limit the disclosure; for example, in some other embodiments, only one of the elastic component 2136 and the damper 2137 is disposed between the movable component 2132c and the dock 2131c; in another embodiment, there may be no elastic component 2136 and damper 2137 disposed between the movable component 2132c and the dock 2131c.

In addition, in this embodiment, the appearance of the movable component 2132c is similar to 1.5 of the cushioning units 211 combined together. The movable component 2132c may have one or more hollow portions (not numbered), thus the movable component 2132c can be elastically deformed by a certain amount of external force to reduce or absorb the shock as the cushioning unit 211 does, and the movable component 2132c will return to its original shape when the force is canceled.

In addition, the connecting portion 2133c is movably installed on an end of the movable component 2132c close to the cushioning unit 211; in other words, the movable component 2132c is movable between the dock 2131c and the connecting portion 2133c. Specifically, the connecting portion 2133c is, but not limited to, integrally formed with the cushioning unit 211, and part of the movable component 2132c and the connecting portion 2133c may together form an appearance similar to that of one of the cushioning units 211. And the movable component 2132c and the connecting portion 2133c are movable toward or away from each other.

In more detail, in this embodiment, the movable component 2132c may have a plurality of mounting posts 21323c, the connecting portion 2133c may have a plurality of mounting holes 21331c, and the mounting posts 21323c respectively correspond to the mounting holes 21331c. Each of the elastic components 2135c is, but not limited to, a compression spring. The elastic components 2135c may be respectively sleeved on the mounting posts 21323c of the movable component 2132c and each of the elastic components 2135c may be partially fixed in the respective mounting hole 21331c of the connecting portion 2133c. In such an arrangement, the mounting posts 21323c are respectively movably located in the mounting holes 21331c. When the movable component 2132c and the connecting portion 2133c are being moved toward each other, the mounting posts 21323c are inserted further into the mounting holes 21331c and the elastic components 2135c are further compressed. And the elastic potential energy stored in the deformed elastic components 2135c will be used to push the movable component 2132c and the connecting portion 2133c back to their original positions. Alternatively, in other embodiments not shown in the drawings, the plurality mounting holes 21331c may be formed on the movable component 2132c, and the plurality mounting posts 21323c may be formed on the connecting portion 2133c. And such an alternative replacement of the mounting holes and mounting posts can be comprehended with the reference of the aforementioned discussions.

In addition, each of the elastic supporting components 2134c may be a plate having a wavy shape matching the shapes of the movable component 2132c and connecting portion 2133c. The elastic supporting component 2134c may be made of any suitable elastic and flexible material, such as metal or plastic. As shown, one end of the elastic supporting component 2134c may be fixed on the dock 2131c or the main casing 110, and the other end of the elastic supporting component 2134c may be fixed to the connecting portion 2133c or the cushioning unit 211 that is connected to the connecting portion 2133c. The elastic supporting components 2134c are constantly in contact with the outer surfaces of the movable component 2132c and the connecting portion 2133c and can clamp the movable component 2132c and the connecting portion 2133c, thereby maintaining the relative position of the movable component 2132c and the connecting portion 2133c and also facilitating to return the movable component 2132c and the connecting portion 2133c to their original positions. Similarly, the elastic supporting components 2134c can be elastically deformed to reduce or absorb the external shock applied thereto and will return to its original shape when the shock is canceled.

Figure 8:
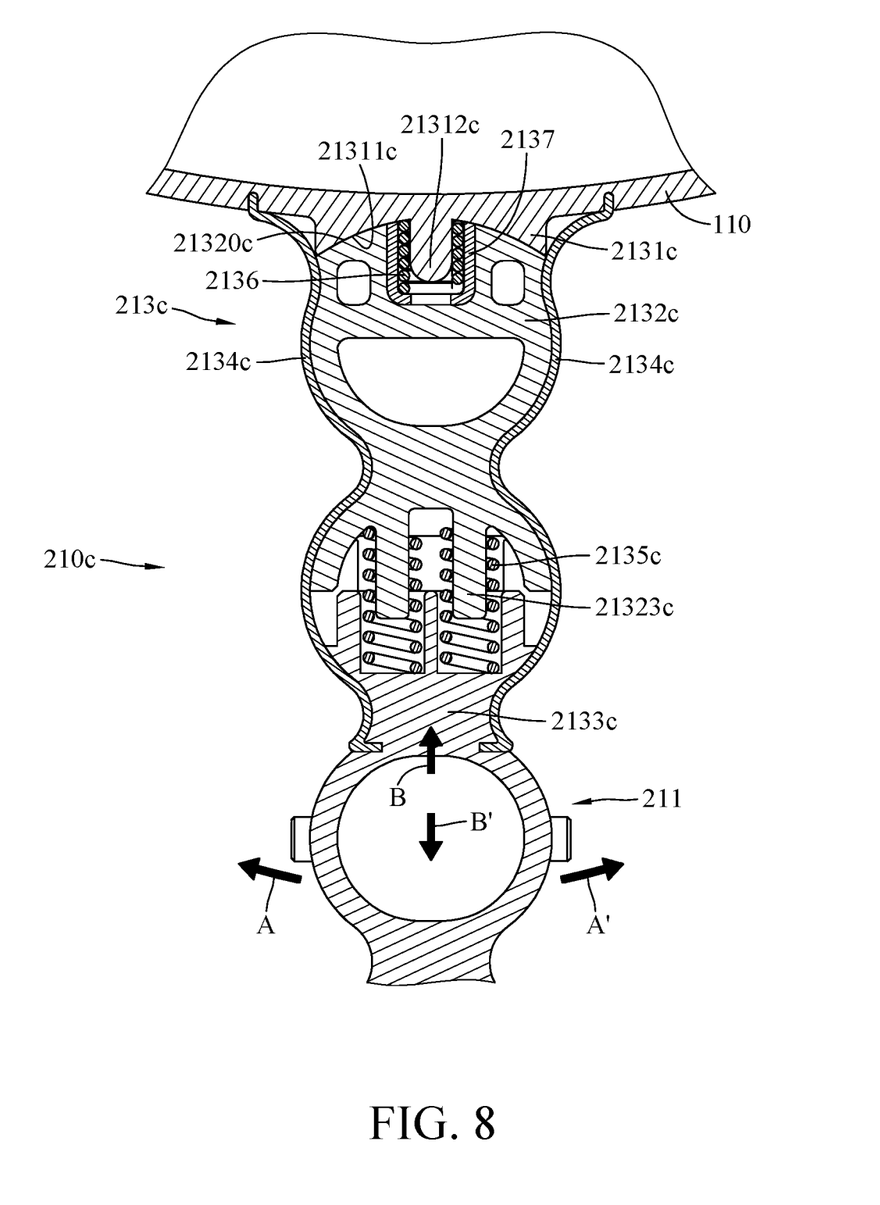
FIG. 8 is a partial enlarged cross-sectional view of a handle core in FIG. 6.

Herein, please refer to FIG. 8, the design of the neck portion 213c allows the cushioning unit 211 to swing relative to the main casing 110 (e.g., arrow A or A') and/or to move towards or away from the main casing 110 (e.g., arrow B or B'). During the movement of the cushioning unit 211 relative to the main casing 110, the elastic components 2136 and the damper 2137 between the dock 2131c and the movable component 2132c, the elastic components 2135c between the movable component 2132c and the connecting portion 2133c, and the elastic supporting components 2134c clamping the movable component 2132c and the connecting portion 2133c all can provide cushioning and support to restore the cushioning units 211 and the device main portion 10. Accordingly, the neck portion 213c can give a multi-directional cushioning to protect the handle core 210c from various shocks.

However, the above is merely one of the exemplary neck portions of the disclosure and the disclosure is not limited thereto. For example, please refer to FIGS. 9-11 to see another neck portion of the disclosure. For the purpose of simple and clear illustration, FIGS. 9-11 may only illustrate part of the handle portion. In addition, one of the main differences between this and previous embodiments is the design of the handle portion and the associated features, thus only the differences will be described below, and the same or similar components can be comprehended with the reference of the aforementioned discussions.

Figure 9:
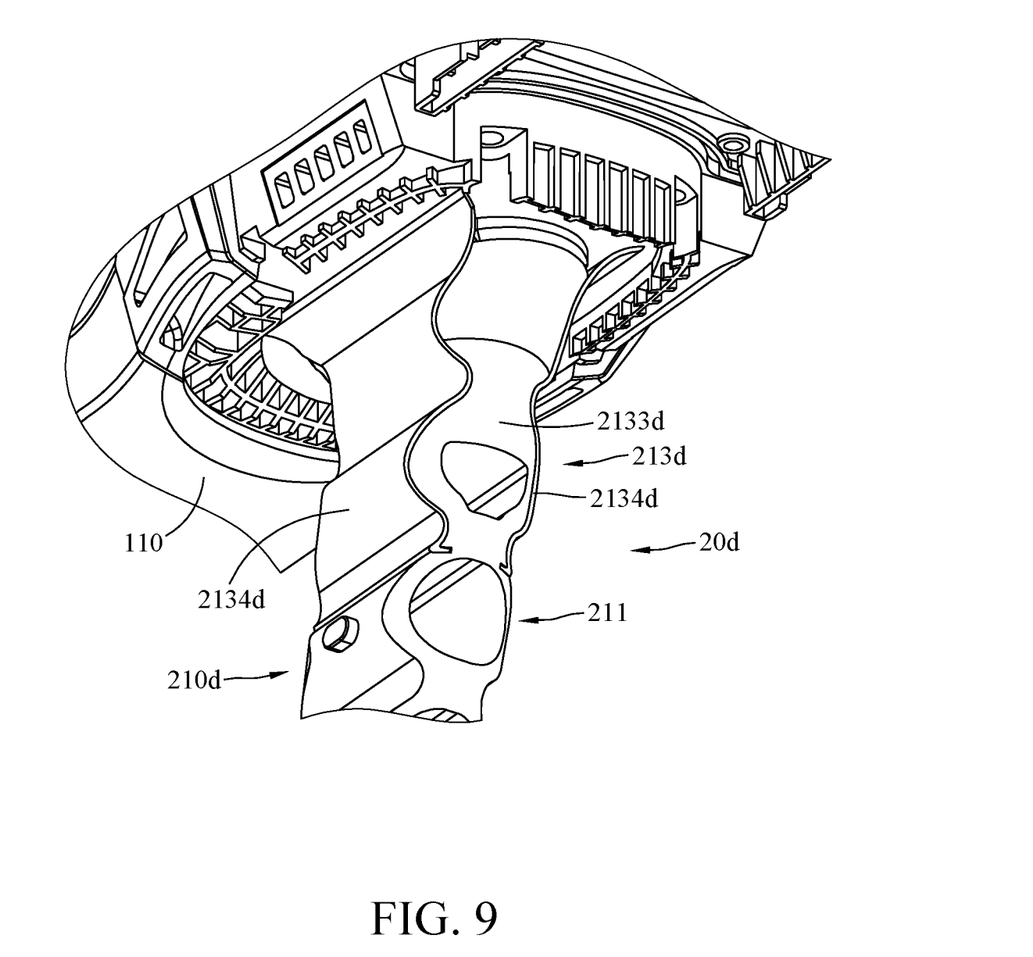
FIG. 9 is a partial enlarged perspective view of an electronic device according to further another embodiment of the disclosure.
Figure 10:
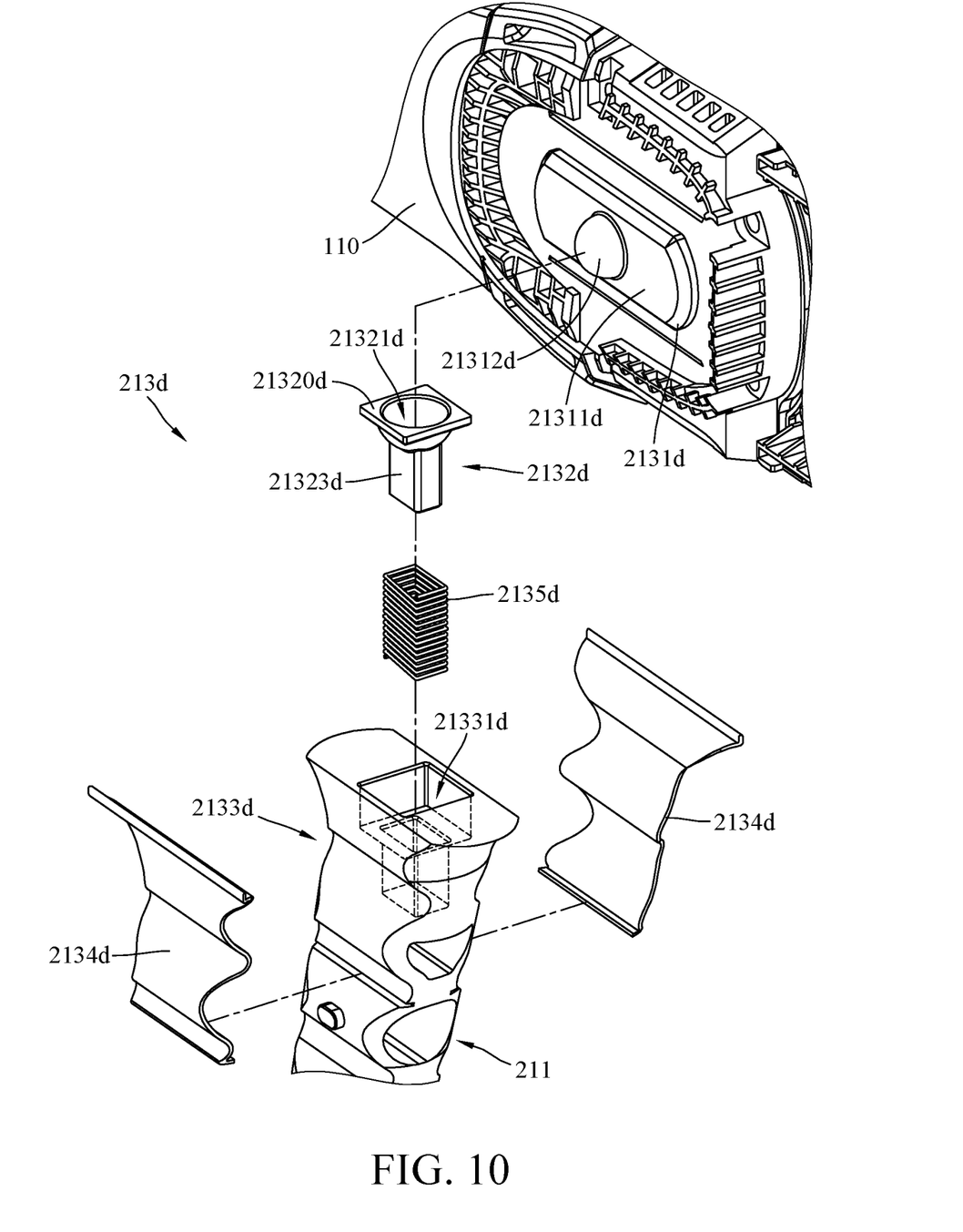
FIG. 10 illustrates an exploded perspective view of a neck portion in FIG. 9.

As shown, in this embodiment, a handle portion 20d has a handle core 210d, the handle core 210d has a neck portion 213d, and the neck portion 213d may include a dock 2131d, a movable component 2132d, a connecting portion 2133d, at least one elastic supporting component 2134d, and an elastic component 2135d. The connecting portion 2133d is located at an end of the cushioning unit 211 close to the main casing 110.

The dock 2131d is disposed on a side of the main casing 110 close to the cushioning unit 211. A contact surface 21311d of the dock 2131d may be substantially a flat surface, and a protrusion 21312d of the dock 2131d may be a half-spherical protrusion or a three-quarter spherical protrusion. The appearance of the movable component 2132d is substantially in a T-like shape. Correspondingly, a top surface 21320d of the movable component 2132d may be substantially a flat surface and is spaced apart from the contact surface 21311d of the dock 2131d by a specific distance, and a recess 21321d on the top surface 21320d is a recess having a shape matching the protrusion 21312d. In such an arrangement, the protrusion 21312d is rotatably located in the recess 21321d to achieve a multi-directional rotation with respect to the dock 2131d. In short, the protrusion 21312d is universally pivoted to the recess 21321d. Note that it is optional to add any suitable elastic and shock-absorbing material between the protrusion 21312d and the inner surface of the recess 21321d.

Further, a mounting post 21323d of the movable component 2132d is a single columnar structure, and an elastic component 2135d is, but not limited to, a compression spring sleeved on the mounting post 21323d of the movable component 2132d and partially fixed in a mounting hole 21331d of a connecting portion 2133d. Specifically, one end of the elastic component 2135d presses against the movable component 2132d, and the other end of the elastic component 2135d presses against the connecting portion 2133d. In this arrangement, the mounting post 21323d is movably located at the mounting hole 21331d. When the movable component 2132d and the connecting portion 2133d are being moved towards each other, the mounting post 21323d is inserted further into the mounting hole 21331d so that the elastic component 2135d is further compressed. And the elastic potential energy stored in the deformed elastic component 2135d will be used to push the movable component 2132d and the connecting portion 2133d back to their original positions.

As shown, in this embodiment, the movable component 2132d may be immersed in the mounting hole 21331d of the connecting portion 2133d, and the appearance of the connecting portion 2133d is similar to 2 of the cushioning units 211 combined together. The connecting portion 2133d may have one or more hollow portions (not numbered), thus the connecting portion 2133d can be elastically deformed by a certain amount of external force to reduce or absorb the shock as the cushioning unit 211 does, and the connecting portion 2133d will return to its original shape when the force is canceled.

Each of the elastic supporting components 2134d may be a plate having a wavy shape matching the connecting portion 2133d, and the elastic supporting component 2134d may be made of any suitable elastic and flexible material, such as metal or plastic. As shown, one end of the elastic supporting component 2134d may be disposed on the dock 2131d of the main casing 110, and the other end may be fixed to the connecting portion 2133d of the cushioning unit 211 that is connected to the connecting portion 2133d. The elastic supporting components 2134d are constantly in contact with the outer surface of the connecting portion 2133d and can clamp the connecting portion 2133d, thereby maintaining the relative position of the components of the neck portion 213d and also facilitating to return them to their original positions.

Figure 11:
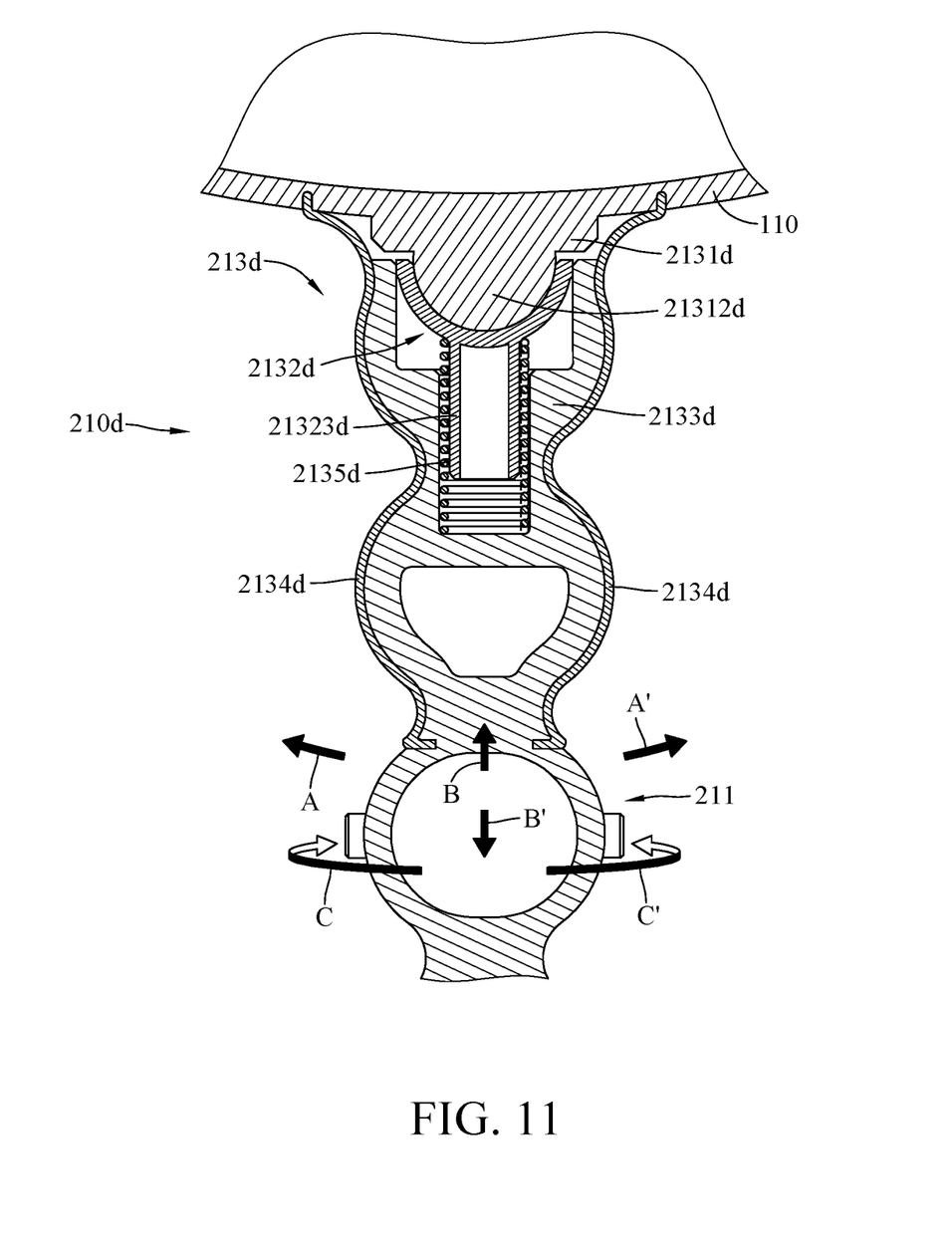
FIG. 11 is a partial enlarged cross-sectional view of a handle core in FIG. 9.

Then, please refer to FIG. 11, the design of the neck portion 213d allows the cushioning unit 211 to rotate relative to the main casing 110 (e.g., arrow C or C'), swing relative to the main casing 110 (e.g., arrow A or A'), and/or move towards or away from the main casing 110 (e.g., arrow B or B'). During the movement of the cushioning unit 211 relative to the main casing 110, the elastic component 2135d between the movable component 2132d and the connecting portion 2133d and the elastic supporting components 2134d clamping the connecting portion 2133d both can give provide cushioning and support to restore the cushioning units 211 and the device main portion 10. Accordingly, the neck portion 213c can give a multi-directional cushioning to protect the handle core 210d from various external forces.

The above are merely exemplary designs of the handle portion of the disclosure, any modification and adjustment that do not depart from the spirit of the disclosure may be applied to the handle portion with the reference to the aforementioned discussions. For examples: in some other embodiments, the quantities of the mounting posts of the movable component of the neck portion, the mounting holes of the connecting portion, and the elastic components installed therebetween may be modified according to the required cushioning effect; in one embodiment, the elastic components in the neck portion may be a ring-shaped rubber or other suitable structure; in another embodiment, there may be only one elastic supporting component installed on the neck portion; in yet another embodiment, the aforementioned damping members may be filled into the hollow portions of the movable component and/or connecting portion.

According to the electronic device as discussed in the above embodiments of the disclosure, the cushioning units extending in a direction away from the device main portion can act as a shock absorber in the handle portion to reduce or absorb the shock caused by the contact of the device with the ground. Therefore, the cushioning unit can effectively avoid the deformation and breakage of the handle and also can avoid excessive shock or vibration to the internal components of the device when the device accidentally drops and collides onto the ground, thereby preventing damage to the device.

In addition, in some embodiments, the cushioning unit may be filled with damping members to further reduce or absorb the shock applied thereto so as to further improve the cushioning ability of the handle portion.

In addition, in some embodiments, the handle portion has a neck portion connected to and located between the device main portion and the cushioning unit, and the neck portion allows the cushioning unit to move towards or away from the device main portion, swing, and/or rotate relative to the device main portion. During these movements of the cushioning unit relative to the device main portion, the neck portion also can give cushioning, support, and responsive return to both the cushioning unit and the device main portion, protecting the device against multi-directional shock.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:
1. An electronic device, comprising:
   a device main portion; and
   a handle portion, connected to the device main portion, the handle portion comprising at least one cushioning unit and an outer sleeve, wherein the at least one cushioning unit extends in a direction away from the device main portion, and the outer sleeve is sleeved on the at least one cushioning unit.
2. The electronic device according to claim 1, wherein the handle portion further comprises at least one button and an electronic component set, the at least one button is config- ured to activate the electronic component set, and the at least one button and the electronic component set are both disposed on the outer sleeve.

3. The electronic device according to claim 1, wherein the outer sleeve is detachably sleeved on the at least one cushioning unit.

4. The electronic device according to claim 3, wherein the at least one cushioning unit has at least one protrusion, the outer sleeve has at least one rail, the at least one protrusion of the at least one cushioning unit is slidably located in the at least one rail.

5. The electronic device according to claim 1, wherein the handle portion further comprises a neck portion, the at least one cushioning unit is movably connected to the device main portion via the neck portion.

6. The electronic device according to claim 5, wherein the neck portion comprises a movable component, a connecting portion, and two elastic supporting components, the movable component is movably connected to the device main portion, the at least one cushioning unit is movably connected to the movable component via the connecting portion, two opposite ends of each of the elastic supporting components are respectively fixed to the device main portion and the at least one cushioning unit, and the elastic supporting components clamp at least one of the movable component and the connecting portion.

7. The electronic device according to claim 6, wherein each of the elastic supporting components is in a shape at least partially matching a shape of at least one of the movable component and the connecting portion.

8. The electronic device according to claim 6, wherein the neck portion further comprises a dock, the dock is fixed on the device main portion, the dock has a curved concave, the movable component has a curved convex, and the curved convex is movably in contact with the curved concave.

9. The electronic device according to claim 8, wherein the neck portion further comprises an elastic component and a damper, the dock has a protrusion, the movable component has a recess, the protrusion is movably located in the recess, the elastic component is sleeved on the protrusion, the damper is sleeved on the elastic component, and the elastic component and the damper are located in the recess.

10. The electronic device according to claim 6, wherein the neck portion further comprises a dock, the dock is fixed on the device main portion, the dock has a protrusion, the movable component has a recess, and the protrusion is universally pivoted to the recess.

11. The electronic device according to claim 6, wherein the neck portion further comprises at least one elastic component, the movable component has at least one mounting post, the connecting portion has at least one mounting hole, the at least one mounting post is movably located at the at least one mounting hole, the at least one elastic component is sleeved on the at least one mounting post, one end the at least one elastic component presses against the movable component, and another end of the at least one elastic component presses against the connecting portion.

12. An electronic device, comprising:
a device main portion; and
a handle portion, connected to the device main portion, the handle portion comprising at least one cushioning unit, wherein the at least one cushioning unit extends in a direction away from the device main portion, the at least one cushioning unit has at least two elastic arm portions and a hollow portion formed between the at least two elastic arm portions.

13. The electronic device according to claim 12, wherein the handle portion further comprises an outer sleeve, and the outer sleeve is sleeved on the at least one cushioning unit.

14. The electronic device according to claim 13, wherein the handle portion further comprises at least one button and an electronic component set, the at least one button is configured to activate the electronic component set, and the button and the electronic component set are both disposed on the outer sleeve.

15. The electronic device according to claim 13, wherein the outer sleeve is detachably sleeved on the at least one cushioning unit.

16. The electronic device according to claim 15, wherein the at least one cushioning unit further has at least one protrusion, the at least one protrusion protrudes from one of the at least two elastic arm portions, the outer sleeve has at least one rail, the at least one protrusion of the at least one cushioning unit is slidably located in the at least one rail.

17. The electronic device according to claim 12, wherein the handle portion further comprises a neck portion, the at least two elastic arm portions of the at least one cushioning unit are movably connected to the device main portion via the neck portion.

18. The electronic device according to claim 17, wherein the neck portion comprises a movable component, a connecting portion, and two elastic supporting components, the movable component is movably connected to the device main portion, the at least two elastic arm portions of the at least one cushioning unit are movably connected to the movable component via the connecting portion, two opposite ends of the elastic supporting components are respectively fixed to the device main portion and the at least two elastic arm portions of the at least one cushioning unit, and the elastic supporting components clamp at least one of the movable component and the connecting portion.

19. The electronic device according to claim 18, wherein the neck portion further comprises a dock, the dock is disposed on the device main portion, the dock has a curved concave, the movable component has a curved convex, and the curved convex is movably in contact with the curved concave.

20. The electronic device according to claim 18, wherein the neck portion further comprises a dock, the dock is disposed on the device main portion, the dock has a protrusion, the movable component has a recess, and the protrusion is universally pivoted to the recess.

* * * * *